(12) United States Patent
Hashimoto

(10) Patent No.: US 6,249,046 B1
(45) Date of Patent: *Jun. 19, 2001

(54) SEMICONDUCTOR DEVICE AND METHOD FOR MANUFACTURING AND MOUNTING THEREOF, AND CIRCUIT BOARD MOUNTED WITH THE SEMICONDUCTOR DEVICE

(75) Inventor: Nobuaki Hashimoto, Suwa (JP)

(73) Assignee: Seiko Epson Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/155,985

(22) PCT Filed: Jan. 28, 1998

(86) PCT No.: PCT/JP98/00338

§ 371 Date: Feb. 18, 1999

§ 102(e) Date: Feb. 18, 1999

(87) PCT Pub. No.: WO98/36450

PCT Pub. Date: Aug. 20, 1998

(51) Int. Cl.$^7$ .................................................. H01L 23/52
(52) U.S. Cl. ..................... 257/691; 257/690; 257/693; 257/668; 257/779; 257/783; 257/697; 257/698; 257/699; 257/780; 257/778
(58) Field of Search ................................ 757/690, 693, 757/668, 779, 783, 697, 698, 699, 780, 778, 691

(56) References Cited

U.S. PATENT DOCUMENTS

| | | | | |
|---|---|---|---|---|
| 5,525,834 | * | 6/1996 | Fischer et al. | 257/691 |
| 5,642,261 | * | 6/1997 | Bond et al. | 361/704 |
| 5,683,942 | * | 11/1997 | Kata et al. | 437/209 |
| 5,796,170 | * | 8/1998 | Marcantonio | 257/786 |
| 5,844,168 | * | 12/1998 | Schueller et al. | 174/52.4 |

FOREIGN PATENT DOCUMENTS 6-69275   3/1994   (JP).

* cited by examiner

Primary Examiner—Minh Loan Tran
Assistant Examiner—Luan Thai
(74) Attorney, Agent, or Firm—Oliff & Berridge, PLC

(57) ABSTRACT

A semiconductor device for surface-mounting that allows of easy mounting. It comprises a semiconductor element 16, an insulating film 12, a wiring pattern 20 formed on a first surface of the insulating film 12 and connected to the semiconductor element 16, bumps 14 formed on the reverse side of the wiring pattern 20 and projecting through holes 12a formed in the insulating film 12 to the second surface of the insulating film 12, and a support plate 24 being electrically conductive and adhered so as to cover the wiring pattern 20 on the first surface of the insulating film 12 and acting as a planarity maintaining member. The support plate 24 is connected to a constant potential portion of the wiring pattern 20.

10 Claims, 11 Drawing Sheets

SEMICONDUCTOR DEVICE AND METHOD FOR MANUFACTURING AND MOUNTING THEREOF, AND CIRCUIT BOARD MOUNTED WITH THE SEMICONDUCTOR DEVICE

TECHNICAL FIELD

The present invention relates to a semiconductor device for surface-mounting, a method of manufacture thereof, and a mounting method for the same and circuit board with the same mounted.

BACKGROUND ART

To pursue downsizing in semiconductor devices, bare chip mounting is the ideal. However, for bare chips, quality control and handling are difficult, and this problem is answered by processing in package form. Particularly in response to the need for high pin counts, in recent years BGA (ball grid array) packages have been developed. BGA packages have a number of different forms, depending on the material of the substrate, but in particular to meet the requirements for mounting fine pitch pad semiconductor elements, and to meet the demands of manufacturing efficiency that fabrication in tape form should be possible to enable continuity, BGA packages using flexible tape exist, in which a flexible material is used as the material of the substrate. Such a BGA package has the bumps which are the external terminals on the flexible substrate disposed in an a real array, to allow surface mounting With this BGA package, the wiring pattern connecting from the chip electrodes to the bumps is formed exposed on the flexible substrate, and during the process of mounting onto a circuit board, careful handling is required to prevent impairment of the quality of the wiring pattern.

Moreover, with a BGA package, not only is checking and testing of the state of connection of the bumps and the circuit board pads impossible, but even if there is a faulty connection repair is impossible, and for this reason high precision is called for in the mounting.

The flexible substrate used for a BGA package, because of its lack of rigidity is liable to distort, thus to cause problems for mounting.

Such a conventional BGA package thus presents a variety of problems at mounting time.

The present invention solves these problems, and has as it object the provision of a semiconductor device for surface-mounting capable of easy mounting, a method of manufacture thereof, and a mounting method for the same and circuit board with the same mounted.

DISCLOSURE OF THE INVENTION

The semiconductor device of the present invention comprises:
  a semiconductor element;
  an insulating film having a through hole;
  a wiring pattern formed on first surface of the insulating film so as to pass over the through hole, and connected to the semiconductor element;
  an external terminal provided on a second surface of the insulating film, and electrically connected through the through hole to the wiring pattern; and
  a support plate being electrically conductive and acting as a planarity maintaining member, and provided to cover at least part of the wiring pattern on the surface of the wiring pattern opposite to that on which the insulating film is provided; and
  the support plate is adhered to the Insulating film with an insulating adhesive interposed therebetween, and is connected to a constant potential portion of the wiring pattern.

This semiconductor device has the surface for forming the wiring pattern different from the surface for forming the bumps, separated by the insulating film, and as a result, on the surface on which the wiring pattern is formed, there are no obstructions other than the wiring pattern. Therefore, a support plate can be used without special processing (patterning) to cover the wiring pattern, and as a result the process of fabrication is extremely simple. Not only can the surface of the wiring pattern be protected, but also, since a support plate of adequate strength to preserve planarity can cover the insulating film, distortion in the flexible insulating film is eliminated, the planar stability of the bumps is improved, and the yield for mounting onto the circuit board is increased.

The support plate is electrically conducting, and is connected to a constant potential portion of the wiring pattern. A constant potential portion raters to a portion whose potential which does not vary during operation of the semiconductor device. By means of insulating adhesive, short circuits between the conductive support plate and the wiring pattern can be prevented.

In this way, with the support plate at a constant potential, since a signal can be transmitted along the planar constant potential formed by the support plate to the wiring pattern, this forms an ideal transmission path, and transmission with the impedance and particularly the inductance low is possible. Thus delays and distortion of a high frequency signal can be reduced, the transmission characteristics can be improved, and a semiconductor device of high reliability can be obtained.

A protective layer may be provided between the support plate and the wiring pattern, covering the wiring pattern.

In other words, on the side of the wiring pattern on which the insulating film is not provided, a protective layer of resist or the like may be provided beforehand over the whole area of the position in which the support plate is adhered, and furthermore the support plate adhered thereon with the interposition of an adhesive. In this case also, since a protective layer is provided on the surface opposite to the surface of the external terminals on the wiring pattern, the application of the resist or the like is simple. When the support plate is provided, since the wiring pattern is already protected by the protective layer, the occurrence of faults such as wiring breaks in the wiring pattern is eliminated.

The constant potential portion may be at one of a power supply potential and a ground potential.

The wiring pattern may have at least partially an arced portion, and the arced portion may be connected to the support plate.

The support plate may be connected to the constant potential portion of the wiring pattern by at least either of solder and an electrically conducting adhesive.

By this means too, the transmission characteristics can be improved.

The semiconductor device of the present invention comprises: a semiconductor element; an insulating film; a wiring pattern formed on the insulating film and connected to the semiconductor element; an external terminal formed on the wiring pattern; and a support plate being electrically conductive and acting as a planarity maintaining member, and supporting a portion of the insulating film; and the support plate is connected to a constant potential portion of the wiring pattern.

By the provision of the support plate, distortion of the flexible insulating film can be prevented, and reliable mounting is made possible.

The support plate is electrically conducting, and is connected to a constant potential portion of the wiring pattern. A constant potential portion refers to a portion whose potential which does not vary during operation of the semiconductor device.

In this way, with the support plate at a constant potential, since a signal can be transmitted along the planar constant potential formed by the support plate to the wiring pattern, this forms an ideal transmission path, and transmission with the impedance and particularly the inductance low is possible. This delays any distortion of a high frequency signal can be reduced, the transmission characteristics can be improved, and a semiconductor device of high reliability can be obtained.

For the support plate may be used a material having a coefficient of thermal expansion larger than the coefficient of thermal expansion of the insulating film.

In the above mentioned semiconductor device, the support plate may have a slit or groove, and an extremity of the insulating film may be inserted into the slit or groove supported by the support plate.

In the above mentioned semiconductor device, the insulating film may have a slit, and an extremity of the support plate may project through the slit to the opposite surface of the insulating film., The method of manufacturing a semiconductor device of the present invention comprises:

a step of forming a through mole in an insulating film a step of forming on a first surface of the insulating film a wiring pattern passing over the through hole;

a step of forming an external terminal on a surface of the wiring pattern on the side of the insulating film, the external terminal projecting through the through hole to a second surface of the insulating film;

a step of connecting a semiconductor element to the wiring pattern and disposing the semiconductor element on the insulating film;

a step of adhering a support plate which is electrically conductive and acts as a planarity maintaining member to a surface of the rewiring pattern opposite to the surface or which the insulating film is provided, to cover at least a part of the wiring pattern; and a step of connecting a portion of the wiring pattern to the support plate.

A semiconductor device manufactured by this method has bumps projecting from the surface opposite to that of the wiring pattern, and the support plate covers the wiring pattern.

With a semiconductor device manufactured by this method, the support plate is at the same potential as a part of the wiring pattern, and since the support plate has a planar form, an electrical connection of low impedance is possible.

In the above described method of manufacturing a semiconductor device, the support plate may be adhered to the insulating film with an insulating adhesive.

In the above described method of manufacturing a semiconductor device, :he insulating film may have an opening portion corresponding to the wiring pattern; and from the second surface of the insulating film a pressure jig may be pressed in through the opening portion, bending and connecting to the support plate a portion of the wiring pattern.

The method of manufacturing a semiconductor device of the present invention comprises: a step of forming a wiring pattern on an insulating film; a step of connecting a semiconductor element to the wiring pattern and disposing the semiconductor element on the insulating film; a step of attaching a support plate supporting an extremity of the insulating film; and a step of electrically connecting a portion of the wiring pattern to the support plate.

With a semiconductor device manufactured by this method, distortion of the flexible insulating film can be prevented, and reliable mounting is possible. Since a part of the wiring pattern is electrically connected to the support plate, a semiconductor device of a construction less susceptible to external interference can be obtained.

The circuit board of the present invention comprises the above described semiconductor device, and a substrate on which is formed a desired conducting pattern; and an external terminal of the semiconductor device is connected to the conducting pattern.

Since the support plate is at a constant potential, the semiconductor device is disposed on a plane at a constant potential. By means of this, the semiconductor device is, like a coaxial cable, constructed to be less susceptible to external interference.

The circuit board of the present invention comprises:

a semi-conductor device including a semiconductor element, an insulating film, a wiring pattern formed on the insulating film and connected to the semiconductor element, a bump formed on the wiring pattern, and a support plate being electrically conductive and acting as a planarity maintaining member and electrically connected to the wiring pattern, and a substrate having a desired conducting pattern formed, and fixed by adhesive to at least an extremity of the insulating film.

According to this circuit board, since at least an extremity of the insulating film is fixed, distortion thereof is prevented. Since the wiring pattern and the support plate are electrically connected, a construction less susceptible to external interference can be obtained.

The method of the present invention of mounting a semiconductor device having an insulating film on which is formed a solder bump, and a support plate being electrically conductive and acting as a planarity maintaining member and electrically connected to the wiring pattern, is a method of mounting a semiconductor device:

wherein adhesive is applied to at least an extremity of the insulating film, the semiconductor device is adhered to a circuit board, and the solder bump is melted and the semiconductor device is connected to a pad of the circuit board.

According to the present invention, the insulating film is fixed with adhesive and distortion of the insulating film is eliminated before the electrical connection is carried out with solder. Since the wiring pattern and the support plate are electrically connected, a construction less susceptible to external interference can be obtained.

BEST MODE FOR CARRYING OUT THE INVENTION

The present invention is now described in terms of a number of preferred embodiments, with reference to the drawings.

First Embodiment

Figure 1:
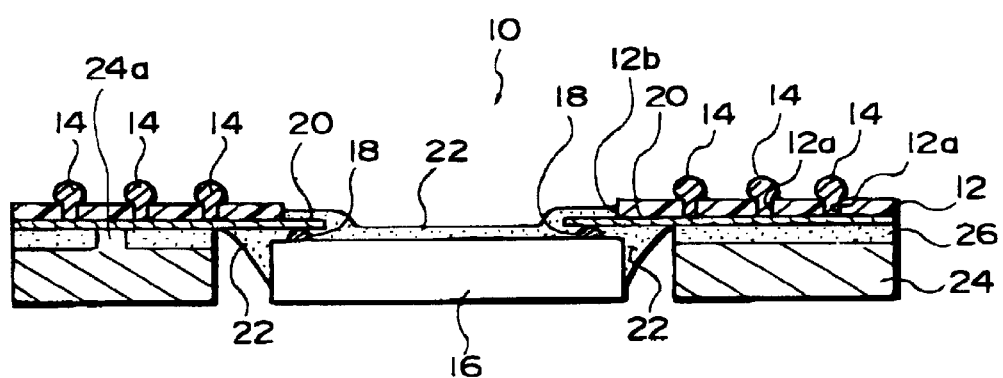
FIG. 1 shows a first embodiment of a semiconductor device.

FIG. 1 shows a first embodiment of the semiconductor device. A semiconductor device 10 is applied to a BGA package. In this figure, on an insulating film 12 a plurality of bumps 14 are formed, and electrodes 18 of a semiconductor chip 16 and the bumps 14 are connected by a wiring pattern 20.

The insulating film 12 is obtained by punching from a long film carrier tape, by the application of TAB (Tape Automated Bonding) technology. In this insulating film 12 are formed through holes 12a. The through holes 12a are formed over the wiring pattern 20 formed on first surface of the insulating film 12. Then through these through holes 12a, bumps 14 are formed to project from the wiring pattern 20 on the other side of the insulating film 12. That is to say, the bumps 14 project on the opposite surface from the wiring pattern 20. By means of this, the construction is such that the wiring pattern 20 is not exposed on the side on which the bumps 14 are formed. The bumps 14 are formed for example of solder, and with a ball-shaped upper portion. The bumps 14 may be formed integrally using solder as far as the interior of the through holes 12a, or another conducting element may be provided at least in the through holes 12a and solder mounted thereon, in place of solder may be used for example copper or the like.

A device hole 12b is formed in the insulating film 12, and an extremity of the wiring pattern 20 projects into the device hole 12b. The device hole 12b is used for connecting the wiring pattern 20 and the electrodes 18 of the semiconductor chip 16. That is to say, the semiconductor chip 16 is disposed so as to be positioned an the side of the insulating film 12 on which the wiring pattern 20 is formed, and the electrodes 18 are positioned inside the device hole 12b, and the wiring pattern 20 and electrodes 18 are bonded.

Next the connection region of the semiconductor chip 16 and insulating film 12 is sealed by potting with an epoxy resin 22.

Further, a characteristic of this embodiment is that on the insulating film 12 is provided a support plate 24. In more detail, the support plate 24 is adhered over the wiring pattern 20, with an insulating adhesive 26 interposed. The support plate 24 may be of stainless steel, but may preferably be formed of high-conductivity copper or copper alloy or the like.

By means of this, the wiring pattern 20 is covered and protected by the insulating adhesive 26 and support plate 24. In particular, the insulating adhesive 26 forms a protective layer similar to a solder resist.

The insulating adhesive 26 may be formed as a thermosetting or thermoplastic film, and may be applied beforehand to the support plate 24. The support plate 24 can be subjected to thermocompression bonding to the surface of the insulating film 12 having the wiring pattern 20.

In this way, by the provision of the support plate 24, distortion and bending of the insulating film 12 is avoided, the height of the bumps 14 is made constant, and the planar stability is improved, thus increasing the mounting yield on the circuit board.

This support plate 24 may have a resist provided on the wiring pattern 20, and then be adhered thereon with an insulating adhesive interposed. By means of this, it is possible to prevent the support plate 24 from being adhered with impurities included.

The support plate 24 has a projection 24a formed, and this projection 24a is connected to a constant potential of the wiring pattern 20, for example ground potential or the power supply potential. The projection 24a is shown in the figure as provided in a single location, but may be provided in all portions being the constant potential of the wiring pattern 20.

According to this construction, the support plate 24 is at the same potential as the point on the wiring pattern 20 to which it is connected through the projection 24a.

The wiring pattern 20 is disposed above the planar constant potential formed on the support plate 24 with the insulating adhesive 26 interposed. In particular, if the constant potential is ground potential, since a high frequency signal can be transmitted along the planar ground potential to the wiring pattern 20, there is an ideal transmission path as in a coaxial cable. This means that the impedance and inductance of the wiring pattern 20 can be controlled.

Since the impedance and inductance are due to the adhesive and resist layer (when provided), they can be controlled by changing the thickness thereof. Moreover, as a result of this control ability, delays and distortion of the high frequency signal can be reduced, and the transmission characteristics improved.

In this embodiment, as shown in FIG. 1, on the surface of the insulating film 12 on the side of the support plate 24 is formed the wiring pattern 20, and the spacing between the two is made small. By means of this, the spacing between the wiring pattern 20 and the support plate 24 is made small. Thus if the capacitance is C, the opposing area of the wiring pattern 20 and support plate 24 is S, the distance between the wiring pattern 20 and support plate 24 is d, the permittivity of a vacuum is $\epsilon_0$, and the relative permittivity is $\epsilon$, the following holds:

$$C \epsilon \epsilon_0 S/d$$

Thus it the distance d is small, the capacitance is increased, and an ideal transmission path is obtained.

In place of ground potential, the support plate 24 may be connected by the projection 24a to the power supply potential of the wiring pattern 20. In this case again, since the power supply potential is a constant potential, the influence on the signals transmitted to the wiring pattern 20 can be kept low.

For the junction with the semiconductor element, the so-called B-TAB type, in which the side of the wiring pattern has a projection formed integrally, may equally be used. This observation applies equally to all of the following embodiments.

This embodiment is a reverse TAB type, in which the semiconductor chip 16 is mounted an the same surface of the insulating film 12 that the wiring pattern 20 is formed, but a front TAB type in which the semiconductor chip 16 is mounted on the opposite surface to the wiring pattern 20 may equally be used, in this case, the reverse surface of the semiconductor chip 18 contacts the circuit board, and therefore if connected to the circuit board with a thermally conducting adhesive material such as silver paste interposed, the heat dispersion of the semiconductor chip 16 can be improved. The through holes 12a in the insulating film 12 may be omitted, bumps formed on the wiring pattern 20, and a solder resist layer formed on the side of the wiring pattern 20, avoiding these bumps. These alternative methods of formation apply equally to all of the following embodiments. By means of the thickness of the semiconductor chip 16, a constant height can be obtained between the insulating film and the circuit board. As a result of this, short circuits between adjacent solder bumps can be prevented, for example.

Second Embodiment

Figure 2:
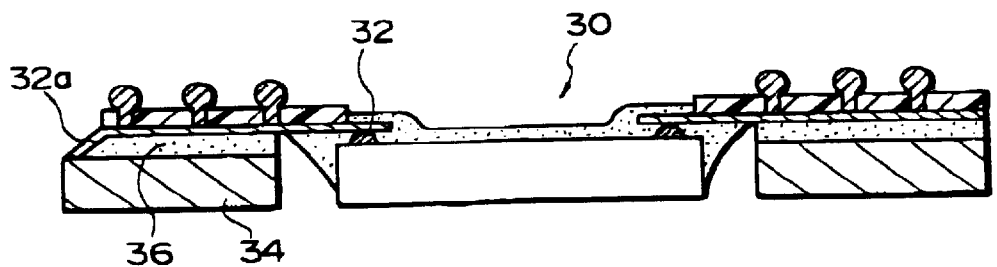
FIG. 2 shows a second embodiment of a semiconductor device.

FIG. 2 shows a second embodiment of the semiconductor device. In this figure, a semiconductor device 30 differs from the semiconductor device 10 shown in FIG. 1 in the construction of the electrical connection between the wiring pattern 32 and the support plate 34. That is to say, in FIG. 2, an extension portion 32a at the left edge of the wiring pattern 32 is bent and connected to the support plate 34. The method of connection is as described in the third embodiment below. The extension portion 32a is provided at a portion at the ground potential of the wiring pattern 32. The extension portion 32a is shown in the figure at one extremity only, but may equally be provided at all portions at the ground potential of the wiring pattern 32, and may be provided not only at an extremity but also at another position. The support plate 34 is formed of copper or the like having high electrical conductivity and good thermally conduction.

According to this construction, the support plate 34 is at the same potential, that is to say, ground potential, as the wiring pattern 32 to which it is connected through the extension portion 32a. Thus the wiring pattern 32 is disposed above the planar ground potential formed on the support plate 34 with an insulating adhesive 36 interposed. In this way, since a high frequency signal can be transmitted along the planar ground potential to the wiring pattern 32, there is an ideal transmission path as in a coaxial cable. This means that the impedance and inductance of the wiring pattern 32 can be controlled since the impedance and inductance are due to the adhesive and resist layer (when provided), they can be controlled by changing the thickness thereof Moreover, as a result of this control ability, delays and distortion of the high frequency signal can be reduced, and the transmission characteristics improved.

In place of ground potential, the support plate 34 may be connected by the extension portion 32a to the power supply potential of the wiring pattern 32. In this case again, since the power supply potential is a constant potential the influence of the signals transmitted to the wiring pattern 32 can be kept low.

Third Embodiment

Figure 3A:
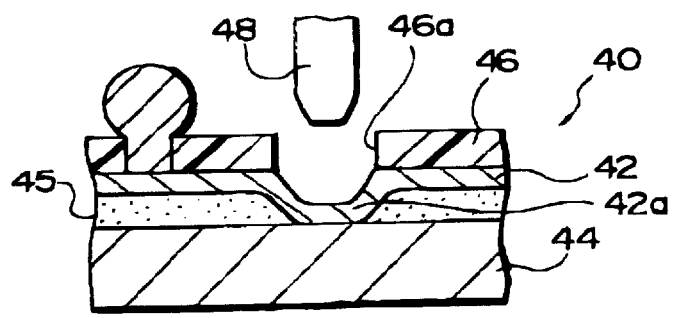
FIGS. 3A and 3B show a third embodiment and a variant thereof of a semiconductor device.
Figure 3B:
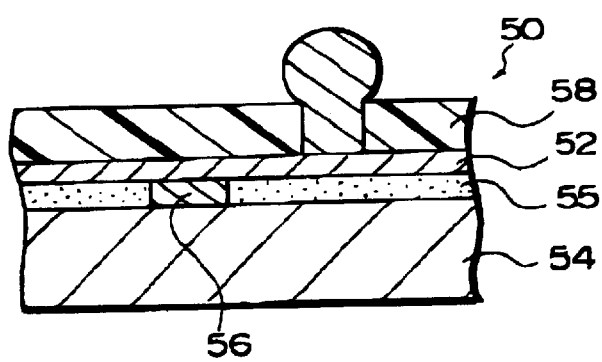

FIGS. 3A and 3B show a modification of the second embodiment described above, seen from the junction means.

In FIG. 3A, a semiconductor device 40 has a part of a wiring pattern 42 bent to form a convexity 42a, and this convexity 42a is connected to a support plate 44. The connectivity 42a is formed at a portion of the wiring pattern 42 being a constant potential, such as ground potential or the power supply potential. In this way, the support plate 44 is at a constant potential, and a benefit similar to that described for the second embodiment can be obtained.

The convexity 42a is formed by pressing with a pressure jig 48 from a hole 46a formed in an insulating film 46. That is to say, corresponding to the portion of the wiring pattern 42 in which the convexity 42a is formed, a hole 46a is formed in the insulating film 46, and from this hole 46a toward the support plate 44, the wiring pattern 42 is pressed by a pressure jig 48, to form the convexity 42a and join it to the support plate 44.

In the region in which the convexity 42a is formed, the insulating adhesive 45 is preferably removed. When forming the convexity 42a, heat or ultrasound vibration is applied by the pressure jig 48. Furthermore, gold plating is applied to the wiring pattern 42. For the wiring pattern 42, in addition to gold plating the well-known techniques of tin plating or solder plating may also be used. On the other hand, if metal plating 15 also applied to the support plate 44, the convexity 42a and support plate 44 are easier to join.

The semiconductor device 50 shown in FIG. 38 has a wiring pattern 52 and support plate 54 joined by a conducting adhesive 56. For this connection, corresponding to the portion of the wiring pattern 52, joined to the support plate 54, an insulating adhesive 55 is removed, and the conducting adhesive 56 provided, the support plate 54 being subjected to thermocompression bonding to an insulating film 58.

Alternatively, in place of the conducting adhesive 56, solder may be used. In this case, when the support plate 54 and insulating film 58 are subjected to thermocompression bonding, heating to the melting point of solder is necessary.

For this modification also, a benefit similar to that described for the second embodiment can be obtained.

For the junction with the semiconductor element, the so-called B-TAB type, in which the side of the wiring pattern has a projection formed integrally, may equally be used.

Fourth Embodiment

Figure 4:
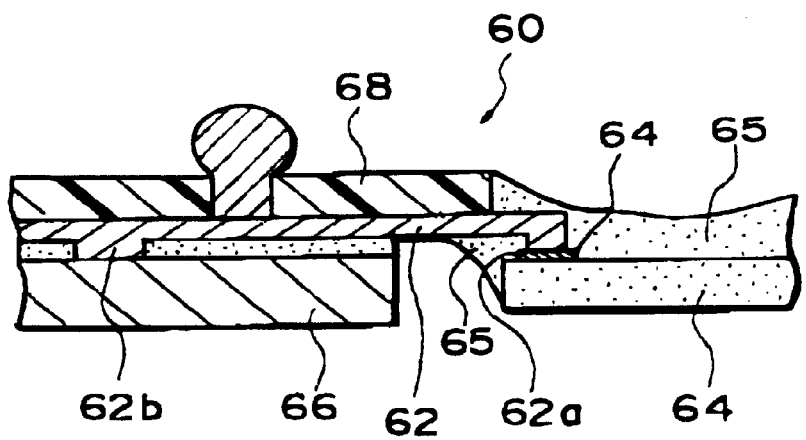
FIG. 4 shows a further variant being a fourth embodiment.

FIG. 4 shows another modification of the third embodiment, and is an example of the so-called "B-TAB type" alluded to above. In this figure, a wiring pattern 62 of a semiconductor device 60 has a projection 62a for connection to an electrode 64a of a semiconductor chip 64, and also a projection 62b for connection to a conductive support plate 66. The semiconductor chip 64 is covered by resin 65. By means of this, the ground potential or power supply potential of the wiring pattern 62 and the support plate 66 can be connected. The projection 62b and support plate 66 are connected at the same time that the support plate 66 is attached by thermocompression bonding to the insulating film 68 having the wiring pattern 62. The remainder of the construction is the same as in the embodiment shown in FIG. 38 and description is omitted here.

Fifth Embodiment

Figure 5A:
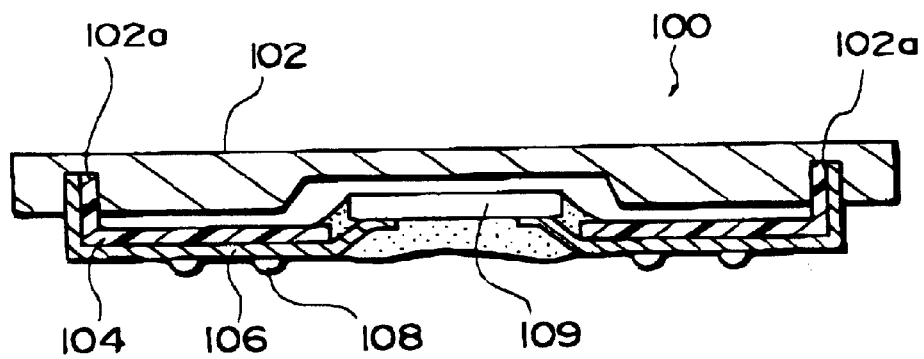
FIGS. 5A to 5C show a fifth embodiment and a variant thereof of a semiconductor device.
Figure 5B:
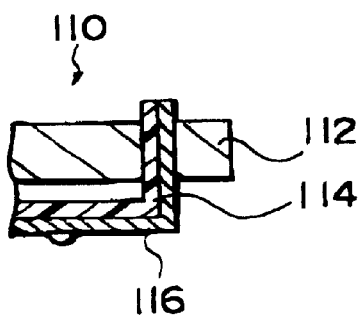
Figure 5C:
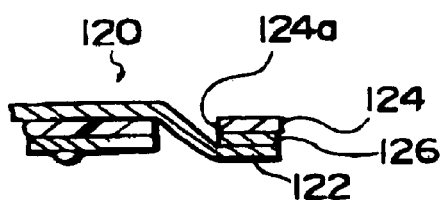

FIGS. 5A to 5C show a fifth embodiment of the semiconductor device. In FIG. 5A, a semiconductor device 100 has an insulating film 104, a wiring pattern 106, bumps 108, and a semiconductor chip 109, and the extremities of the insulating film 104 and wiring pattern 106 are supported by a support plate 102. The support plate 102 is formed of a material with high conductivity.

In more detail, a groove 102a formed in the support plate 102 has an extremity of the insulating film 104 inserted, whereby the extremity of the insulating film 104 is supported. The wiring pattern 106 is supported by the support plate 102 and electrically connected. The portion of the wiring pattern 106 connected to the support plate 102 is the same as in the first embodiment, and since the same effect of the electrical connection is obtained, description is omitted here.

While the support plate 102 has the necessary strength to maintain planarity, the insulating film 104 is flexible. As a result, by supporting the extremities of the insulating film 104 with the support plate 102, the planarity of the flexible insulating film 104 is maintained. Moreover, distortion of the insulating film 104 is restricted, and reliable mounting can be carried out. It is preferable that:
coefficient of thermal expansion of support plate 102>coefficient of thermal expansion of insulating film 104

By means of this, when the semiconductor device 100 is mounted on a circuit board, in a reflow process a tension is applied to the insulating film 104 by the support plate 102, and the insulating film 104 is taut, and since as a result flatness is obtained, the bumps 108 can be reliably mounted on the circuit board.

For the junction with the semiconductor element, the so-called B-TAB type, in which the side of the wiring pattern has a projection formed integrally, may equally be used. In this embodiment, the example shown has a space between the support plate 102 and the insulating film 104, but equally there may be no space.

FIG. 5B shows a modification of the fifth embodiment. In this figure, a semiconductor device 110 differs from the semiconductor device 100 described above in that extremities of an insulating film 114 and wiring pattern 116 are inserted into a slit 112a formed in a support plate 112.

In FIG. 5C also, a modification of the fifth embodiment is shown. In this figure, a semiconductor device 120 has an extremity of a support plate 122 inserted into a slit 124a formed in an insulating film 124, whereby the extremity of the insulating film 124 is supported. In more detail, from first surface of the insulating film 124, the extremity support plate 122 is inserted through the slit 124a to a second surface while undergoing elastic deformation, and the planarity of the insulating film 124 is maintained by the restoring force of the support plate 122. By means of this, the support plate 122 and wiring pattern 126 are electrically connected.

For these semiconductor devices 110 and 120 also, the same effect as with the semiconductor device 100 can be obtained.

For the junction with the semiconductor element, the so-called R-TAB type, in Which the side of the wiring pattern has a projection formed integrally, may equally be used.

Sixth Embodiment

Figure 6:
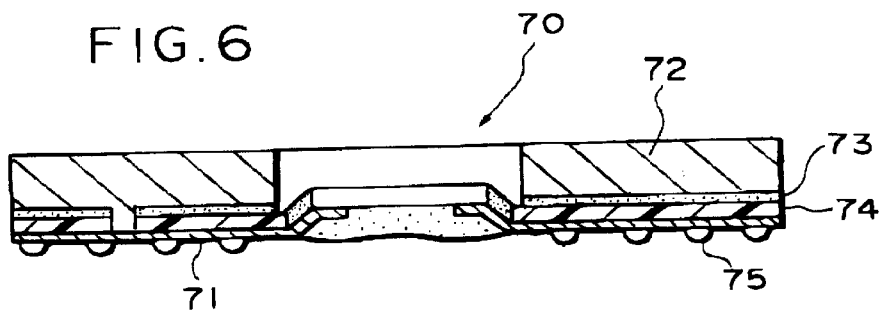
FIG. 6 shows a sixth embodiment of a semiconductor device.

The semiconductor device 70 shown in FIG. 6 differs from the above described fourth embodiment in that a support plate 72 and insulating film 74 are fixed over the whole surface by an adhesive 73. Here it is preferable that the following hold;
coefficient of thermal expansion of support plate 72>coefficient of thermal expansion of insulating film 74

By means of this, when the semiconductor device 70 is mounted an a circuit board, in a reflow process a tension is applied to the insulating film 74 by the support plate 72, and the insulating film 74 is taut, and since as a result flatness is obtained, the solder balls 75 can be reliably mounted on the circuit board. The construction of the electrical connection between a wiring pattern 71 and support plate 72 is the same as shown in FIG. 1, and description is omitted here.

Seventh Embodiment

Figure 7:
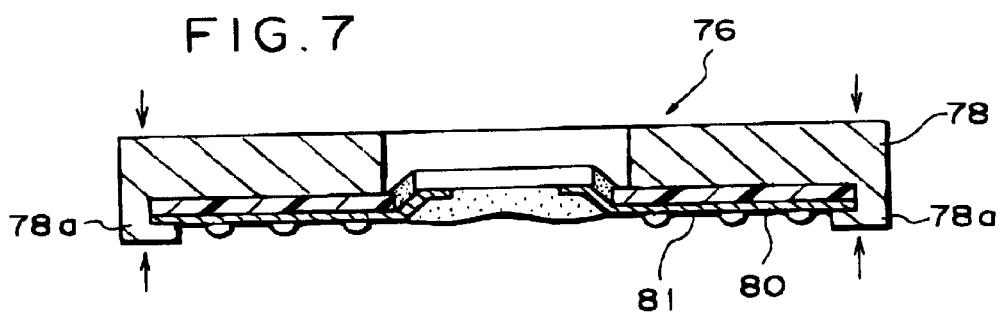
FIG. 7 shows a seventh embodiment of a semiconductor device.

The semiconductor device 76 shown in FIG. 7 has the extremities 78a of a support plate 78 and the extremities of an insulating film so and wiring pattern 81 caulked in the direction shown by arrows. By this means, the support plate 78 and insulating film 80 are fixed, and moreover an electrical connection between the wiring pattern 81 and support plate 78 is achieved. According to this embodiment, in mass production, secure fastening of the support plate 78 is achieved without the use of adhesive.

Eighth Embodiment

Figure 8:
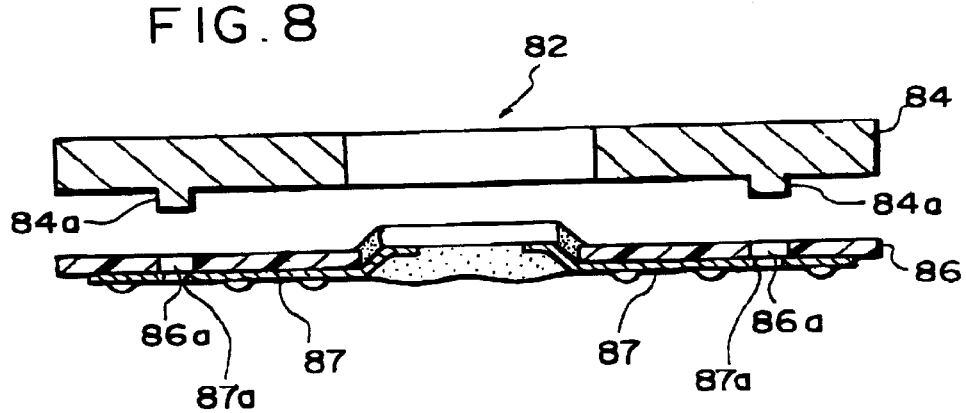
FIG. 8 shows a eighth embodiment of a semiconductor device.

In the semiconductor device 82 shown in FIG. 8, support plate 84 has projections 84a being for example pins, holes 86a are formed in an insulating film 86, and holes 87a are formed in a wiring pattern 87. The projections 84a engage with the holes 86a and holes 87a, to attach the support plate 84 to the insulating film 86. The diameter of the holes 87a is formed to be slightly smaller than the diameter of the holes 86a, and a reliable electrical connection between the wiring pattern 87 and the support plate 87 is achieved.

The projections 84a may equally be formed by bending the extremities of the support plate 84. By this means, in mass production, secure fastening of the support plate 84 is achieved without the use of adhesive.

Ninth Embodiment

Figure 9:
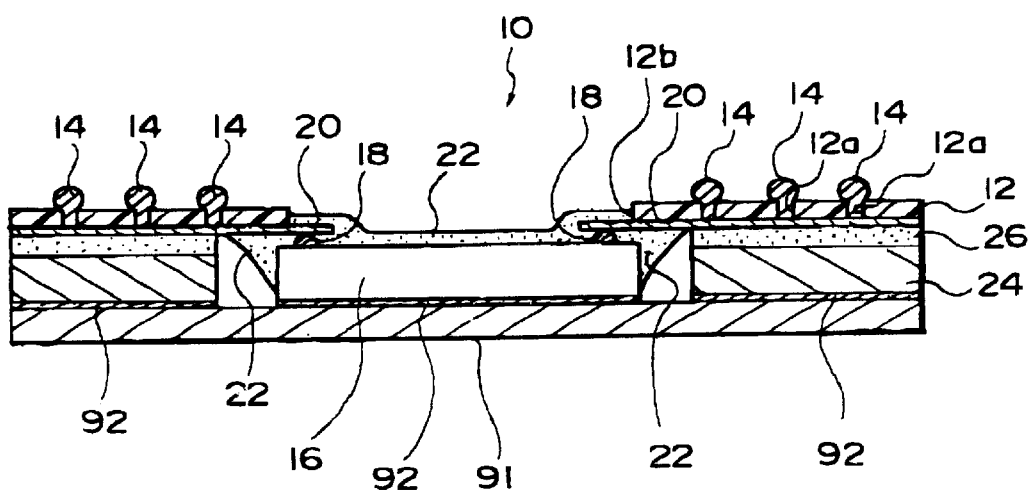
FIG. 9 shows a ninth embodiment of a semiconductor device.

The semiconductor device 90 shown in FIG. 9 comprises the semiconductor device 10 shown in FIG. 1 with the attachment of a heat radiator ("heat spreader") 91. In more detail, the reverse surface of the semiconductor chip 16 (the surface opposite of the electrodes 18) and the support plate 24 are spread with adhesive 92, and the heat radiator 91 is adhered. The adhesive 92 includes silver or the like to be of high thermal conductivity and of high electrical conductivity, and the heat radiator 91 is constructed of a material which is of high thermal conductivity and of high electrical conductivity. By means of this, the heat radiator 91 promotes the dispersion of heat from the semiconductor chip 16, and also ensures that the reverse surface of the semiconductor chip 16 is connected lo a constant potential. Thus faulty operation of the semiconductor chip 16 is prevented, and the reliability is improved.

Tenth Embodiment

Figure 10:
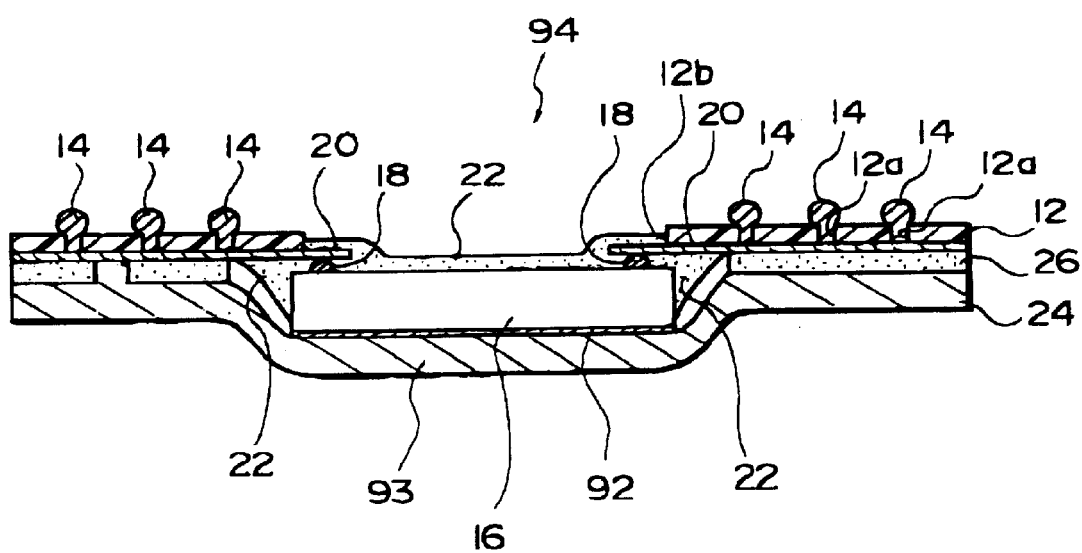
FIG. 10 shows a tenth embodiment of a semiconductor device.

The semiconductor device 94 shown in FIG. 10 has the support plate 24 and heat radiator 91 of the semiconductor device 90 shown in FIG. 9 replaced by an integrally formed support plate 93. The support plate 93 is bent to form integrally a portion adhered to the insulating film 12 and a portion adhered to the reverse surface of the semiconductor chip 16. Using a support plate 93 of this type, the same effect as in the above described embodiment can be obtained.

Eleventh Embodiment

Figure 11:
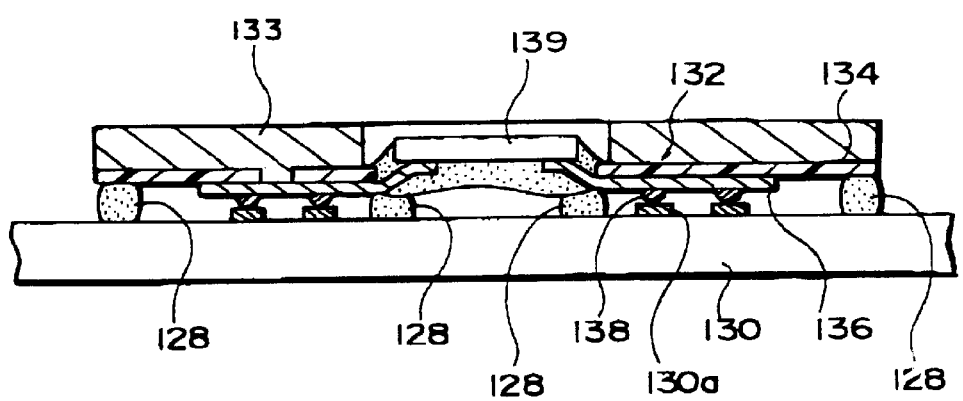
FIG. 11 shows a eleventh embodiment of a circuit board.

FIG. 11 shows an eleventh embodiment being a circuit board. In FIG. 11, a circuit board 130 has a semiconductor device 132 mounted thereon. The semiconductor device 132 comprises an insulating film 134, a wiring pattern 136, bumps 138, and a semiconductor chip 139, and on the circuit board 130 are formed pads 130a for the purpose of bonding the bumps 138. A support plate 133 is adhered to the insulating film 134.

The semiconductor device 132 is adhered to the circuit board 130 by an adhesive 128 provided at the extremities and central region of the insulating film 134. This adhesion is carried out before the reflow process. That is to say, the semiconductor device 132 is first temporarily adhered to the circuit board 130 by the adhesive 128, then after distortion of the insulating film 134. It is eliminated, the bumps 138 and pads 130a are joined. To eliminate the distortion of the insulating film 134, it is preferable that at least the extremities of the insulating film 134 are fixed by the adhesive 128. As the adhesive 128 is preferably used a substance which undergoes a reaction at less than the melting point of solder, and after first connecting the semiconductor device 132 with the adhesive 128, the solder is fused. In this way, so-called elimination of distortion is carried out.

According to this embodiment, using the adhesive 128, distortion in the insulating film 134 is eliminated, and therefore satisfactory mounting is enabled.

For the junction with the semiconductor element, the so-called B-TAB type, in which the side of the wiring pattern has a projection formed integrally, may equally be used. This embodiment has the support plate 133, but it is possible to maintain flatness even with the support plate 133 omitted.

Twelfth Embodiment

Figure 12A:
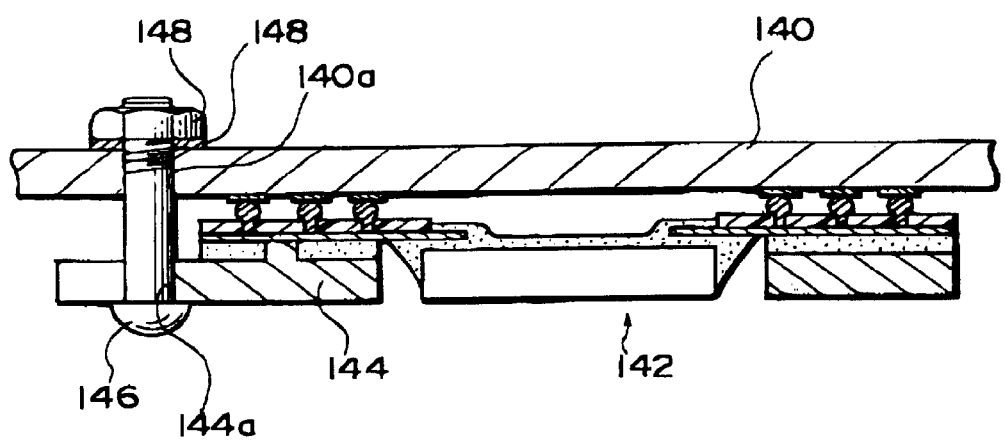
FIG. 12A shows a twelfth embodiment of a circuit board.
Figure 12B:
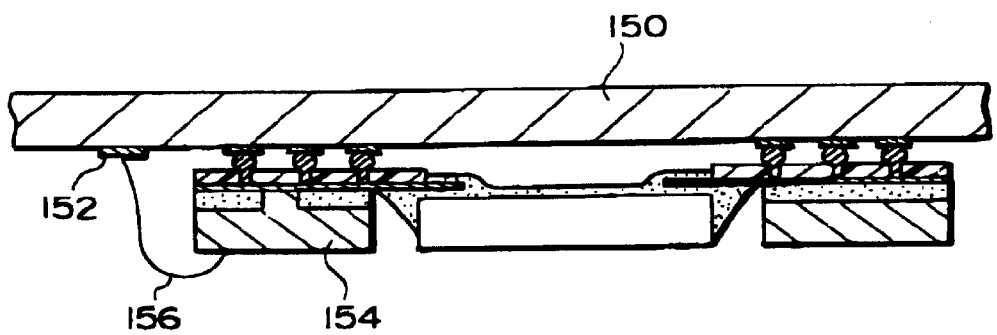
FIG. 12B shows a variant of the twelfth embodiment.

FIG. 12A shows a twelfth embodiment of a circuit board, In this figure, a semiconductor device 142 is mounted on a circuit board 140. The semiconductor device 142 is the same as the semiconductor device 10 shown in FIG. 1 except for a Support plate 144, and description is omitted here.

The support plate 144 comprises copper, stainless steel, copper-based alloy, or Other material of high conductivity, and has a hole 144a formed through which a screw 146 is passed. This screw 146 is also electrically conducting. In the circuit board 140 is also formed a hole 140a through which the conductive screw 146 is passed, and on first surface is formed a ring-shaped pad 148 around this hole 140a. The pad 148 is connected to a constant potential such as the ground potential or power supply potential of the circuit board 140. Then the support plate 144 and circuit board 140 are fixed by the screw 146 passing through the holes 144a and 140a and a nut 149.

In this way, with the screw 146 interposed, the planar support plate 144 is at a constant potential such as ground potential or power supply potential. By means of this, in the semiconductor device 142, since signals can be transmitted along the planar constant potential the high frequency signal transmission characteristics are improved.

The screw fixing by means of the screw 146 is preferably carried out after soldering. In this embodiment, a single screw 146 is used, but there may equally be a plurality of screws. When screws 146 are provided in opposing positions, they are preferably provided for example at four corners.

FIG. 128 shows a modification of the twelfth embodiment. In this figure, a pad 152 formed on a circuit board 150 and a support plate 154 are connected by a wire 156. Here the pad 152 is connected to a constant potential. Therefore, the support plate 154 is also at a constant potential, and the high frequency signal transmission characteristics are improved. The wire 156 is provided by soldering or by a conventional wire bonding technique, for example using ultrasound. Thereafter the wire may be protected by resin.

For the junction with the semiconductor element, the so-called B-TAB type, in which the side of the wiring pattern has a projection formed integrally, may equally be used.

Figure 13:
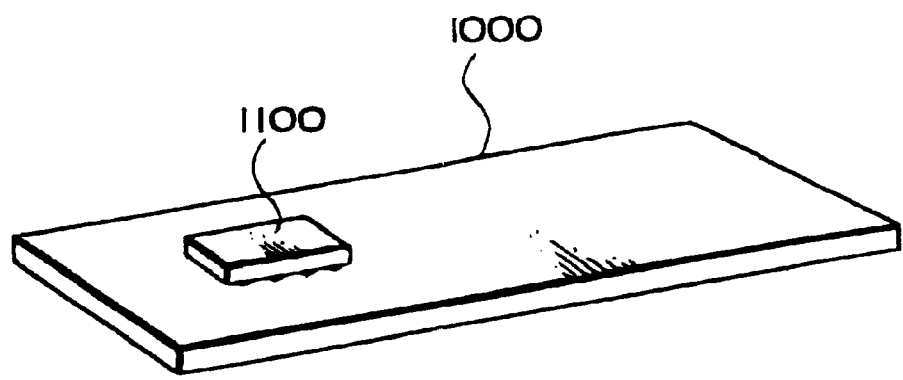
FIG. 13 shows a circuit board mounted with a semiconductor device fabricated by application of the method of the present invention.

In FIG. 13 is shown a circuit board 1000 on which is mounted a semiconductor device 1100 to which the present invention is applied. The circuit board generally uses an organic compound substrate such as glass epoxy. On the circuit board is formed a wiring pattern of for example copper to form a desired circuit, and by mechanical connection of the wiring pattern and the bumps of the semiconductor device, the electrical connection is achieved. In this case, it the above described semiconductor device is provided with a construction for absorbing strain generated by differences in thermal expansion with the exterior, when this semiconductor device is mounted on the circuit board and thereafter, the reliability can be improved. If appropriate attention is paid to the wiring of the semiconductor device, the reliability during connection and the reliability after connection can be improved. The mounting area can also be reduced to the area for mounting as a bare chip. Therefore, when this circuit board is used in an electronic instrument, the electronic instrument itself can be made more compact. Within the same area, greater effective mounting space can be made available, and it is possible to design for greater functionality.

Figure 14:
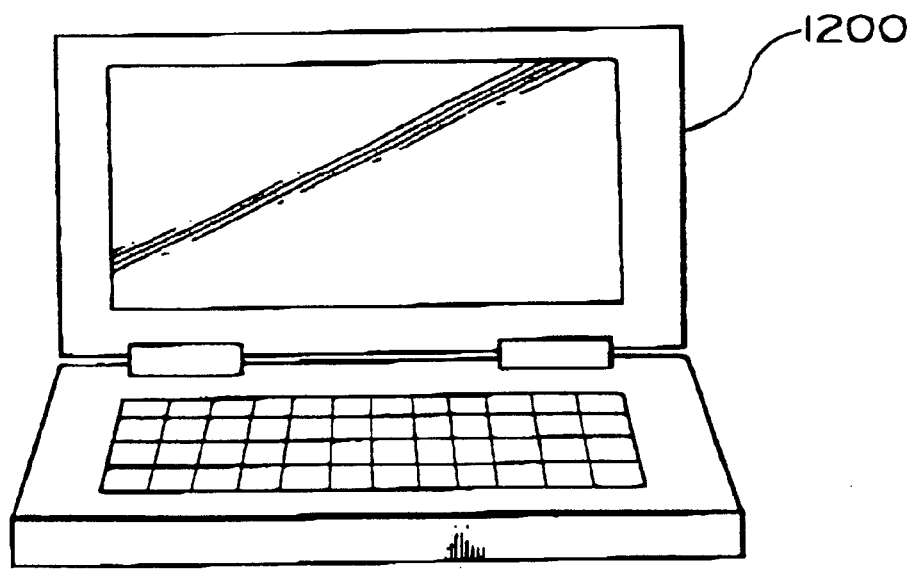
FIG. 14 shows an electronic instrument equipped with a circuit board mounted with a semiconductor device fabricated by application of the method of the present invention.

As an electronic instrument provided with this circuit board 1000, FIG. 14 shows a notebook personal computer 1200.

It should be noted that, the present invention can be applied to any surface mount electronic component which, in similar to a semiconductor device requires a plurality of bumps, whether active or passive. Electronic components include, for example, resistors, capacitors, coils, oscillators, filters, temperature sensors, thermistors, varistors, variable resistors, and fuses.

What is claimed is:

1. A semiconductor device comprising:

a semiconductor element;

an insulating film having a through hole;

a wiring pattern formed on a first surface of the insulating film so as to pass over the through hole, and connected to the semiconductor element;

an external terminal provided on a second surface of the insulating film, and electrically connected through hole to the wiring pattern; and a support plate being electrically conductive and acting as a planarity maintaining member, and provided to cover at least part of the wiring pattern on a surface of the wiring pattern opposite to a surface on which the insulating film is provided;

wherein the support plate is adhered to the insulating film with an insulating adhesive interposed therebetween, and is connected to a constant potential portion of the wiring pattern; and wherein one of the wiring pattern and the support plate has an integral projecting portion for electrical connection to the other.

2. The semiconductor device of claim 1,
wherein a protective layer is provided between the support plate and the wiring pattern, covering the wiring pattern.

3. The semiconductor device of claim 1,
wherein the constant potential portion is at one of a power supply potential and a ground potential.

4. The semiconductor device of claim 1, wherein the wiring pattern has a bent portion toward the support plate as the projecting portion for electrical connection with the support plate.

5. A semiconductor device of claim 1, wherein the support plate has an integral projection toward the wiring pattern as the projecting portion for electrical connection with the wiring pattern.

6. A circuit board comprising the semiconductor device of claim 1, a substrate on which is formed a desired conducting pattern, an external terminal of the semiconductor device being connected to the conducting pattern.

7. The semiconductor device of claim 1, wherein the wiring pattern has a projection toward the support plate as the projecting portion for electrical connection with the support plate.

8. The semiconductor device of claim 1, wherein the support plate has an integral projection toward the wiring pattern as the projecting portion for electrical connection with the wiring pattern, a penetrating hole is formed in the wiring pattern and the insulating film, and the projection engages with the hole.

9. A semiconductor device comprising:
a semiconductor element;
an insulating film;
a wiring pattern formed on the insulating film and connected to the semiconductor element;
an external terminal formed on the wiring pattern; and
a support plate being electrically conductive and acting as a planarity maintaining member, and supporting a portion of the insulating film, the support plate being connected to a constant potential portion of the wiring pattern;
wherein the support plate has one of a slit and a groove, and an extremity of the insulating film is inserted into the one of the slit and the groove and supported by the support plate.

10. A semiconductor device comprising:
a semiconductor element;
an insulating film;
a wiring pattern formed on the insulating film and connected to the semiconductor element;
an external terminal formed on the wiring pattern; and
a support plate being electrically conductive and acting as a planarity maintaining member, and supporting a portion of the insulating film, the support plate being connected to a constant potential portion of the wiring pattern;
wherein the insulating film has a slit, and an extremity of the support plate projects through the slit to an opposite surface of the insulating film.

* * * * *

UNITED STATES PATENT AND TRADEMARK OFFICE
CERTIFICATE OF CORRECTION

PATENT NO.    : 6,249,046 B1
DATED         : June 19, 2001
INVENTOR(S)   : Noguaki Hashimoto It is certified that error appears in the above-identified patent and that said Letters Patent is hereby corrected as shown below:

<u>Title page,</u>
Item [54], please change the Title from "SEMICONDUCTOR DEVICE AND METHOD FOR MANUFACTURING AND MOUNTING THEREOF, AND CIRCUIT BOARD MOUNTED WITH THE SEMICONDUCTOR DEVICE" to -- SEMICONDUCTOR DEVICE, A METHOD OF MANUFACTURE THEREOF, AND A MOUNTING METHOD FOR THE SAME AND CIRCUIT BOARD WITH THE SAME MOUNTED -- and
Please insert -- [30] Foreign Application Prioity Date: February 13, 1997
[JP] Japanese Patent Application 9-44811 --

Signed and Sealed this

Thirteenth Day of August, 2002

*Attest:*

*Attesting Officer*

JAMES E. ROGAN
*Director of the United States Patent and Trademark Office*